United States Patent [19]

Coe

[11] Patent Number: 4,885,533

[45] Date of Patent: Dec. 5, 1989

[54] ELECTRICAL CIRCUIT TEST PROBE HAVING AN ELONGATE CYLINDRICAL RETAINING AND SLIDING BEARING REGION

[75] Inventor: Thomas D. Coe, Boxford, Mass.

[73] Assignee: Q A Technology Company, Inc., Hampton, N.H.

[21] Appl. No.: 242,786

[22] Filed: Sep. 9, 1988

[51] Int. Cl.$^4$ .................. G01N 31/02; G01R 31/02
[52] U.S. Cl. ......................... 324/158 P; 324/72.5; 439/482
[58] Field of Search ........... 324/158 F, 158 P, 73 PC, 324/72.5, 65 P, 61 P; 439/482, 824

[56] References Cited

U.S. PATENT DOCUMENTS

| | | | |
|---|---|---|---|
| 4,397,519 | 8/1983 | Cooney | 324/158 F X |
| 4,504,780 | 3/1985 | Marsella | 324/72.5 X |
| 4,659,987 | 4/1987 | Coe et al. | 324/158 F X |

FOREIGN PATENT DOCUMENTS 3410093 10/1985 Fed. Rep. of Germany .
0085872 4/1987 Japan .

Primary Examiner—Reinhard J. Eisenzopf
Assistant Examiner—Vinh P. Nguyen
Attorney, Agent, or Firm—Davis, Bujold & Streck

[57] ABSTRACT

A probe for providing electrical contact to electrical circuits during the testing thereof. There is a tubular housing having an open end and a generally closed end with a main portion extending from the generally closed end towards the open end and a retaining and sliding bearing portion adjacent the open end having a diameter small than the main portion. A probe plunger is disposed in the tubular housing and has a cylindrical inner portion which is a slide fit and disposed within the main portion of the tubular housing and a cylindrical outer portion of a diameter smaller than the inner portion and forming a shoulder with the inner portion at a point of meeting. The outer portion of the plunger passes through the retaining and sliding bearing portion and has an outside diameter which is a slide fit to the inside diameter of the retaining and sliding bearing portion. A longitudinally compressible bias spring is disposed between the generally closed end of the tubular housing and the inner portion of the probe plunger under a pre-loading for biasing the probe plunger towards an extended position.

4 Claims, 2 Drawing Sheets

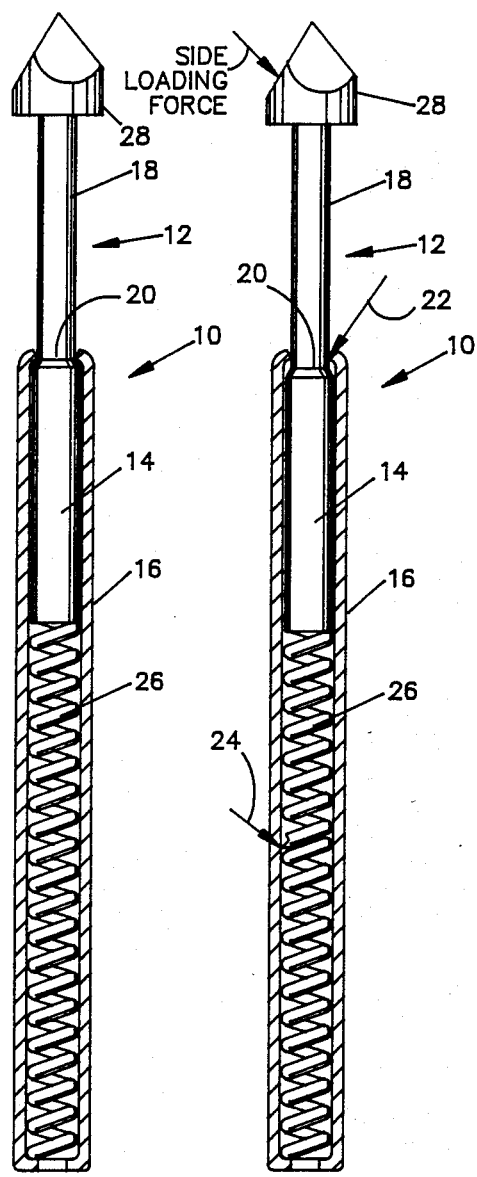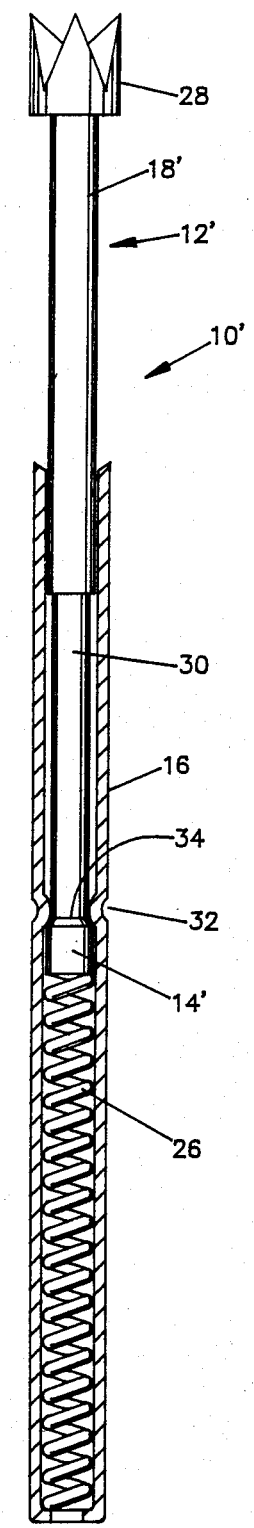
FIG. 1  FIG. 2
PRIOR ART
FIG. 3

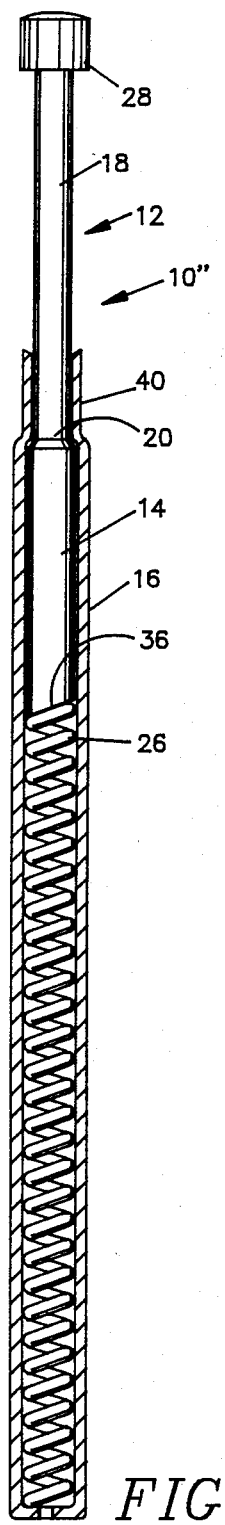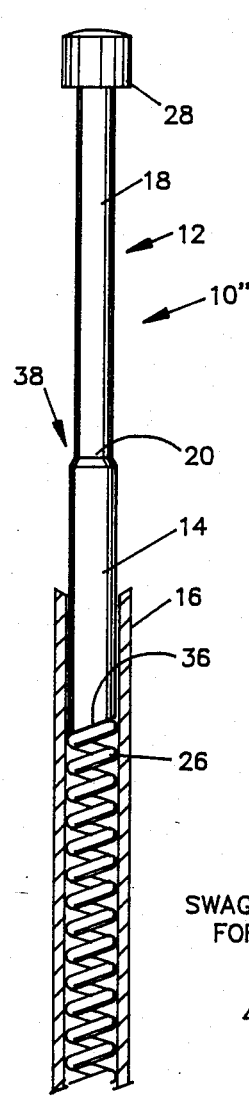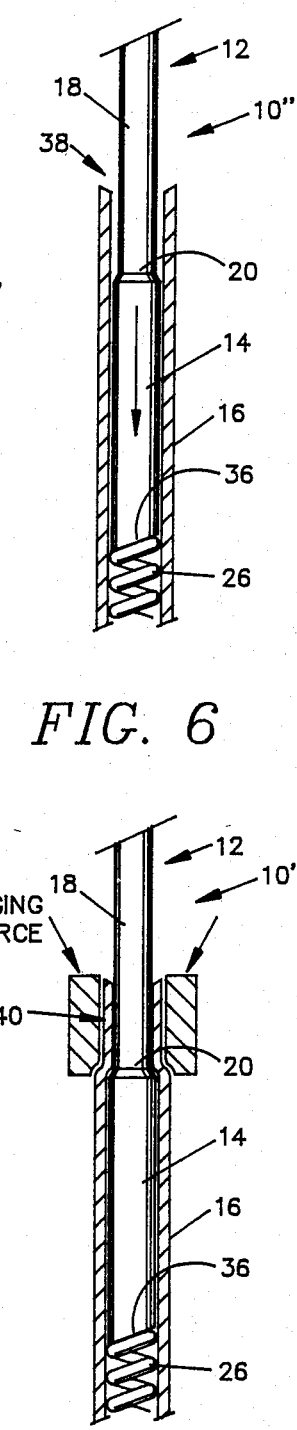
FIG. 4
FIG. 5
FIG. 6
FIG. 7

ELECTRICAL CIRCUIT TEST PROBE HAVING AN ELONGATE CYLINDRICAL RETAINING AND SLIDING BEARING REGION

BACKGROUND OF THE INVENTION

The present invention relates to probes used for testing electrical circuits and, more particularly, to a probe for providing electrical contact to electrical circuits during the testing thereof comprising, tubular housing having an open end and a generally closed end having a small cleaning hole therethrough; a probe plunger disposed in the tubular housing, the probe plunger comprising a cylindrical inner portion being a slide fit within the tubular housing and a cylindrical outer portion of a diameter smaller than the inner portion and forming a shoulder with the inner portion at a point of meeting; a longitudinally compressed bias spring disposed between the closed end of the tubular housing and the inner portion of the probe plunger for urging the probe plunger to an extended position; and, a cylindrical retaining and sliding bearing region formed adjacent the open end of the tubular housing and having the outer portion of the plunger passing therethrough, the retaining and sliding bearing region having an internal diameter which is a slide fit to the outside diameter of the outer portion.

Test probes are used in groups of hundreds or thousands for contacting a printed circuit board under test. Computer-based testers are used to supply signals and analyze outputs from the board under test. One hundred percent production testing of computer boards and other electronic equipment board is the typical industry standard.

For such tests to be efficient and accurate, the probes employed must be very reliable. In prior art test probes, there are several points of probe failure. One is the failure of the probe's tip to pierce the flux or oxide films on the solder-coated pads of the circuit board. This problem typically applies to in-circuit testing after components are assembled to the board and the board itself has been wave soldered, or the like, to affix the components to the board. Another major point of probe failure is a result of internal wear of the probe itself, which generates contaminating particulates. These particulates, in turn, prevent good electrical contact between the probe plunger and the tubular housing. This wear can be caused by spring fatigue (which allows sharp broken coils to scrape particles from the tubular housing's internal surfaces) or as a result of probe side loading. Side loading occurs if probe points engage the sloped sides of solder lumps or bent component leads, or if single pointed probes enter misaligned holes in test boards.

The probe generally indicated as 10 in FIG. 1 represents an early design in the art. It was manufactured in strokes up to 0.16 inches for 0.1 inch mounting centers. The probe plunger 12 comprises an inner portion 14 which has a diameter sized to be a slide fit in the tubular housing 16. An outer portion 18 extends outward concentrically from the inner portion 14. The outer portion 18 is of a smaller diameter than the inner portion 14 thereby forming a shoulder 20 at their point of joining. The probe plunger 12 is retained in the tubular housing 16 by crimping the housing around the outer portion 18. As depicted in FIG. 2, the tolerances must be kept quite close to prevent problems. If the tolerance between the outside diameter of the inner portion 14 is not very close with respect to the inner diameter of the tubular housing 16, the plunger 12 scrapes the sharp edge of the crimp, as indicated by the arrow 22, generating wear particles which rapidly degrade the performance of the probe 10. If the tolerance is too close, the plunger 12 can bind in the housing 16, causing probe failure. Likewise, excessive side loading can cause rubbing and wear regardless of the tolerances held during assembly. Also, as mentioned above and as indicated by the arrow 24, breaking of the outward bias spring 26 can cause sharp edges that produce undesired and damaging particles through scraping.

Industry testing requirements developed in the late 1970's created a demand for longer stroke probes; that is, the distance the tip 28 carried by the end of the outer portion 18 can move inward towards the housing 16. In response to these requirements, the industry soon adopted the probe configuration of FIG. 3, which resolved the wear problems of the prior art probes of FIGS. 1 and 2 while offering the required longer stroke. The probe 10' of FIG. 3 remains the most common configuration throughout the industry to date. Examples can be seen in U.S. Letters Pat. No. 4,397,519 of Cooney and U.S. Letters Pat. No. 4,659,987 of Coe et al., the latter patent being assigned to the common assignee of this application.

While solving the wear problem and offering a longer stroke (relatively speaking as compared to the prior art), a continuing problem with the prior art probe design of FIG. 3 is that the evolved standard industry dimensions for the equipment in which it is employed do not permit adequate space for a long life spring which will also provide enough force to reliably pierce board contaminants as described above. Long spring fatigue life becomes particularly important in universal test beds. Such beds use 100 test probes per square inch and frequently use 30 or 40 thousand probes per bed. In this style of tester, the same probes are used over and over again for all the types of boards tested. Probes in such a tester will often encounter 250,000 test cycles per year. Spring breakage is a serious concern using the probes 10' of FIG. 3.

Another problem with the prior art probe 10' of FIG. 3 is that it is unstable during assembly by the automated apparatus employed for the purpose. Note that the probe plunger 12' of this design has an inner portion 14' and an outer portion 18' of the same diameter separated by a middle portion 30 of reduced diameter. The plunger 12' is retained within the housing 16 by a crimp 32 disposed along the length of the housing 16 at a point which will intercept the shoulder 34 formed by the junction of the inner portion 14' and the middle portion 30. The plunger 12' is guided longitudinally within the housing 16 by the combined effect of the outer portion 18' and inner portion 14' sliding within the tubular housing 16. As can be appreciated by those skilled in the art, however, during assembly the outer portion 18' must fit within the housing 16 a sufficient distance following insertion at one station so as to remain stable during movement to the next station when the plunger can be depressed to pre-load the spring 26 and the crimp 32 made in the housing 16. This forces the spring 26 to be shorter than would be desirable. In order to get the required piercing force at the tip, the spring 26 must, therefore, be quite stiff. This results in a higher propensity to breakage of the spring 26. The prior art probe 10' of FIG. 3 typically provides full stroke spring life below 100,000 cycles. As can be appreciated, in apparatus such as the test bed described above performing 250,000 cycles per year, this means that each of the 30 or 40 thousand probes in the bed only has a spring life expectancy of 4.8 months—following which, the formation of particles through scraping and deterioration of probe performance begins.

Wherefore, it is an object of the present invention to provide a test probe for use in electrical component test beds, and the like, which has a design which resists scraping action between the components which can produce probe-deteriorating particles.

It is another object of the present invention to provide a test probe for use in electrical component test beds, and the like, which has a design which provides increased shut height for a given spring length.

It is still another object of the present invention to provide a test probe for use in electrical component test beds, and the like, which provides increased spring life expectancy without breaking.

Other objects and benefits of the present invention will become apparent from the description which follows hereinafter when taken in conjunction with the drawing figures which accompany it.

SUMMARY

The foregoing objects have been achieved in a probe for providing electrical contact to electrical circuits during the testing thereof and having a probe plunger disposed in a tubular housing and urged outward under the force of a longtiudinally compressed bias spring by the improvement of the present invention to provide long life under repeated compression cycles of the plunger characterized by the plunger comprising a cylindrical inner portion being a slide fit within the tubular housing and a cylindrical outer portion of a diameter smaller than said inner portion and forming a shoulder with said inner portion at a point of meeting and the tubular housing having a cylindrical retaining and sliding bearing region formed adjacent the open end thereof through which said outer portion of said plunger passes, said retaining and sliding bearing region having an internal diameter which is a slide fit to the outside diameter of said outer portion.

DESCRIPTION OF THE DRAWINGS

FIG. 1 is a cutaway elevation drawing of a prior art test probe in a first embodiment.

FIG. 2 is a drawing of the probe of FIG. 1 illustrating some of the problems associated therewith.

FIG. 3 is a cutaway elevation drawing of a prior art test probe in a second embodiment.

FIG. 4 is a cutaway elevation drawing of a test probe according to the present invention.

FIG. 5 is a partial, cutaway drawing of the probe of FIG. 4 showing the probe plunger being inserted into the tubular housing during assembly to pre-load the spring.

FIG. 6 is a partial, cutaway drawing of the probe of the present invention following the insertion step of FIG. 5 and showing the probe plunger inserted into the tubular housing with the spring pre-loaded and prior to forming the retaining end thereon.

FIG. 7 is a partial, cutaway drawing of the probe of the present invention during assembly following the position of FIG. 6 showing the manner in which the probe plunger is held captive in the tubular housing with the spring pre-loaded by the forming of a retaining and sliding bearing region on the end of the tubular housing.

DESCRIPTION OF THE PREFERRED EMBODIMENT

The probe of the present invention is shown in FIGS. 4–7 wherein it is generally indicated as 10″. As those skilled in the art will readily recognize and appreciate, probe 10″ is a modification of the early prior art probe 10 described herein previously with respect to FIGS. 1 and 2. Like the prior art probes which it replaces, the components are all of electrically conductive materials. It should be pointed out immediately, however, that the modifications to the prior art probe of FIGS. 1 and 2 that resulted in the present invention also produced unexpected benefits which were not apparent or obvious. For example, while the prior art probe 10 suffered from a short stroke and scraping of the crimp, the probe 10″ of the present invention has increased the stroke length within the industry standard shut height from 0.16 inch to 0.25 inch—which was the stroke length increase achieved by the change over to the probe 10′ of FIG. 3. Moreover, in tested embodiments, the springs within the probe 10″ of the present invention achieved a minimum cycle life of 3.6 million (3,600,000) deflections at full stroke. This life is stated as "minimum" because, as of this time, no springs have been broken in one hundred test probes tested to that level. A separate test of sixty probes also manufactured in accordance with the present invention resulted in probes tested having a resistance below 30 milliohms with 14 milliohms being a typical resistance. No known commercial probes according to the prior art are known to achieve such characteristics. Because of the unexpected achievements in performance produced by the present invention, it is also worthy of note that the probe can be produced in a miniaturized version which is equally reliable; yet, capable of mounting on 0.050 inch spacing. The benefits relative to testing of electronic circuit boards which also are becoming increasingly miniaturized are readily apparent.

The reason for this increase in performance and reliability as achieved by the present invention is, of course, a product of the change in the spring 26 made possible by the design of the probe 10″. This can be seen with reference to the following table which compares various prior art probes to the probe 10″ of the present invention:

| Typical Probe Mfd By | Probe Length End-To-End (Inches) | Probe Stroke (Inches) | Initial Spring Length (Inches) | Spring Length Fully Compressed (Inches) |
| --- | --- | --- | --- | --- |
| O&B | 1.31 | .25 | .535 | .285 |
| IDI | 1.31 | .25 | .635 | .385 |
| E/C | 1.31 | .25 | .515 | .265 |
| PYL | 1.31 | .25 | .630 | .380 |
| QAT | 1.31 | .25 | .575 | .325 |
| * | 1.31 | .25 | .740 | .490 |

*The probe of this invention

The modifications to the prior art probe 10 of FIGS. 1 and 2 made to achieve the objectives and non-obvious benefits of the present invention can be seen by comparing the drawings of FIGS. 1 and 2 to the drawings of FIGS. 4–7. The tubular housing 16 is of extended length to hold the extended length spring 26 that is possible with the configuration and method of assembly. As compared to the prior art design of FIG. 3, this invention provides 50% more shut height for the spring. The probe plunger 12 is of substantially the same design as the plunger 12 of the prior art probe 10; however, the outer portion 18 is longer and it is preferred that the inner end 36 of the inner portion 14 be angled as shown to create a sideward force that provides improved electrical contact from the housing 16 through to the plunger 12 in a manner known in the art.

During assembly, as depicted in FIG. 5, the spring 26 is first inserted followed by the inner portion 14. Contrary to the design of probe 10' of FIG. 3, the plunger 12 is stable with a relatively short engagement. Thus, the spring in this design can not be longer; but, can be pre-loaded much more than the prior art designs. This additional pre-loading provides more uniform plunger force in the operating range and, additionally, the longer spring fatigue life that provides the above-reported vast increase in cycle life without spring breakage. With the plunger 12 inserted as shown in FIG. 5, it is depressed as shown in FIG. 6 to pre-load the spring 26 and position the shoulder 20 away from the open end 38 of the housing 16. As depicted in FIG. 7, the area of the housing 16 between the shoulder 20 and the open end 38 is then closed by swaging, or the like, to form a reduced diameter retaining and sliding bearing region 40. As can be appreciated, because of the increased spring strength possible in the greater space afforded, in combination with the close clearance elangated sliding bearing of region 40, this design offers extended low electrical resistnce life as well as excellent tolerance to side loading forces. Since the area of contact is an extended one with no exposed corners or edges of the bearing surface of region 40 or the tubular housing 16 in contact with the probe plunger 12 (as compared to the prior art probe 10) there is no potential for the edge scraping produced by that design.

Thus, it can be seen that the probe of the present invention has met its stated objectives by providing a probe that has increased spring length, increased spring loading, increased spring life, and no potential for particle-producing scraping action between any of the components, even in the presence of side loading forces, all with the same stroke length and within the same shut height space as the prior art probes with which it is interchangeably replaceable.

Wherefore, having thus described the present invention, what is claimed is:

1. In a probe for providing electrical contact to electrical circuits during the testing thereof and having a probe plunger disposed in a tubular housing and urged outward under the force of a longitudinally compressed bias spring the improvement to provide long life under repeated compression cycles of the plunger comprising:
   (a) the plunger comprising a cylindrical inner portion being a slide fit within the tubular housing and a cylindrical outer portion of a diameter smaller than said inner portion and forming a shoulder with said inner portion at a point of meeting; and,
   (b) the tubular housing having an elongate cylindrical retaining and sliding bearing region defining an open end thereof through which said outer portion of said plunger passes, said retaining and sliding bearing region having an internal diameter which is a slide fit to the outside diameter of said outer portion.

2. A probe for providing electrical contact to electrical circuits during the testing thereof comprising:
   (a) a tubular housing having an open end and a generally closed end;
   (b) a probe plunger disposed in said tubular housing, said probe plunger comprising a cylindrical inner portion being a slide fit within said tubular housing and a cylindrical outer portion of a diameter smaller than said inner portion and forming a shoulder with said inner portion at a point of meeting;
   (c) a longitudinally compressed bias spring disposed between said generally closed end of said tubular housing and said inner portion of said probe plunger for urging said porbe plunger to an extended position; and,
   (d) an elongate cylindrical retaining and sliding bearing region defining said open end of said tubular housing and having said outer portion of said plunger passing therethrough, said cylindrical retaining and sliding bearing region having an internal diameter which is a slide fit to the outside diameter of said outer portion.

3. A probe for providing electrical contact to electrical circuits during the testing thereof comprising:
   (a) a tubular housing having an open end and a generally closed end, said housing comprising a main portion extending from said generally closed end towards said open end and an elongate retaining and sliding bearing portion defining said open end and having a diameter smaller than said main portion;
   (b) a probe plunger disposed in said tubular housing, said plunger comprising a cylindrical inner portion being a slide fit and disposed within said main portion of said tubular housing and a cylindrical outer portion of a diameter smaller than said inner portion and forming a shoulder with said inner portion at a point of meeting, said outer portion of said plunger passing through said retaining and sliding bearing portion and having an outside diameter which is a slide fit to the inside diameter of said retaining and sliding bearing portion; and,
   (c) a longitudinally compressible bias spring disposed between said generally closed end of said end tubular housing and said inner portion of said probe plunger under a pre-loading for biasing said probe plunger towards an extended position.

4. In a probe for providing electrical contact to electrical circuits during the testing thereof and having a probe plunger disposed in a tubular housing and urged outward under the force of a longitudinally compressed bias spring, the method of assembly comprising the steps of:
   (a) forming a tubular housing having an open and a generally closed end;
   (b) forming a plunger with a cylindrical inner portion to be a slide fit within the tubular housing and a cylindrical outer portion of a diameter smaller than the inner portion and forming a shoulder with the inner portion at a point of meeting;
   (c) inserting the bias spring into the tubular housing;
   (d) inserting the cylindrical inner portion of the plunger into the tubular housing and in contact with the spring;
   (e) compressing the spring with the inner portion to pre-load the spring and position the shoulder spaced inwardly from the open end of the housing; and, (f) compressing the portion of the tubular housing between the shoulder and the open end to form an elongate retaining and sliding bearing region defining the open end through which the outer portion of the plunger passes wherein the retaining and sliding bearing region has an internal diameter which is a slide fit to the outside diameter of the outer portion of the plunger.

* * * * *

REEXAMINATION CERTIFICATE (3657th)

United States Patent [19]

Coe

[11] B1 4,885,533

[45] Certificate Issued Nov. 3, 1998

[54] ELECTRICAL CIRCUIT TEST PROBE HAVING AN ELONGATE CYLINDRICAL RETAINING AND SLIDING BEARING REGION

[75] Inventor: Thomas D. Coe, Boxford, Mass.

[73] Assignee: QA Technology Company, Inc., Hampton, N.H.

Reexamination Request:
No. 90/004,759, Sep. 25, 1997

Reexamination Certificate for:
Patent No.: 4,885,533
Issued: Dec. 5, 1989
Appl. No.: 242,786
Filed: Sep. 9, 1988

[51] Int. Cl.[6] .............................. G01N 31/02; G01R 31/02
[52] U.S. Cl. .................... 324/754; 324/72.5; 439/482
[58] Field of Search ............................... 324/72.5, 754, 324/755, 761; 439/482, 824

[56] References Cited

PUBLICATIONS

"Test Probes", Ostby + Barton Co., Warwick, RI, Circa 1970, p. 16, #100206, p. 19, #100405, p. 21, #100006, p. 21, #100105, p. 23, #100100, p. 25, #100080.

*Primary Examiner*—Vinh P. Nguyen

[57] ABSTRACT

A probe for providing electrical contact to electrical circuits during the testing thereof. There is a tubular housing having an open end and a generally closed end with a main portion extending from the generally closed end towards the open end and a retaining and sliding bearing portion adjacent the open end having a diameter small than the main portion. A probe plunger is disposed in the tubular housing and has a cylindrical inner portion which is a slide fit and disposed within the main portion of the tubular housing and a cylindrical outer portion of a diameter smaller than the inner portion and forming a shoulder with the inner portion at a point of meeting. The outer portion of the plunger passes through the retaining and sliding bearing portion and has an outside diameter which is a slide fit to the inside diameter of the retaining and sliding bearing portion. A longitudinally compressible bias spring is disposed between the generally closed end of the tubular housing and the inner portion of the probe plunger under a pre-loading for biasing the probe plunger towards an extended position.

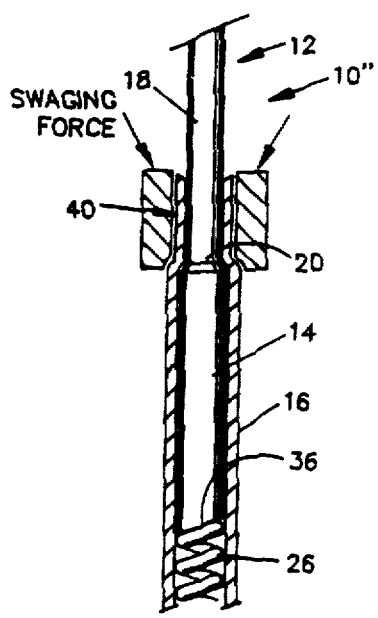

_B1_ 4,885,533

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1–4 are determined to be patentable as amended.

New claims 5–6 are added and determined to be patentable.

1. In a probe for providing electrical contact to electrical circuits during the testing thereof and having a probe plunger disposed in a tubular housing and urged outward under the force of a longitudinally compressed bias spring the improvement to provide long life under repeated compression cycles of the plunger comprising:
   (a) the plunger comprising a cylindrical inner portion being a slide fit within the tubular housing and a cylindrical outer portion of a diameter smaller than said inner portion and forming a shoulder with said inner portion at a point of meeting; *the spring and the cylindrical inner portion being housed in a first region of the tubular housing having an internal diameter and an external diameter;* and,
   (b) the tubular housing having *a second region defining* an elongate cylindrical retaining and sliding bearing [region defining] *having* an open end [thereof] through which said outer portion of said plunger passes, said retaining and sliding bearing [region] *i)* having an internal diameter *smaller than the internal diameter of the first region* which is a slide fit to the outside diameter of said outer portion *and ii) an external diameter smaller than the external diameter of the first region.*

2. A probe for providing electrical contact to electrical circuits during the testing thereof comprising:
   (a) a tubular housing having an open end [and] a generally closed end, *a first region having an internal diameter and an external diameter, and a second region defining an elongate cylindrical retaining and sliding bearing adjacent the open end;*
   (b) a probe plunger disposed in said tubular housing, said probe plunger comprising a cylindrical inner portion being a slide fit within said tubular housing and a cylindrical outer portion of a diameter smaller than said inner portion and forming a shoulder with said inner portion at a point of meeting;
   (c) a longitudinally compressed bias spring disposed between said generally closed end of said tubular housing and said inner portion of said probe plunger for urging said porbe plunger to an extended position; *the spring and the cylindrical inner portion being housed in the first region of the tubular housing* and,
   (d) [an] *the* elongate cylindrical retaining and sliding bearing [region defining said open end of said tubular housing and] having said outer portion of said plunger passing therethrough, said cylindrical retaining and sliding bearing [region] *i)* having an internal diameter *smaller than the internal diameter of the first region* which is a slide fit to the outside diameter of said outer portion *and ii) an external diameter smaller than the external diameter of the first region.*

3. A probe for providing electrical contact to electrical circuits during the testing thereof comprising:
   (a) tubular housing having an open end and a generally closed end, said housing comprising a main portion, *having an internal diameter and an external diameter,* extending from said generally closed end towards said open end and an elongate retaining and sliding bearing portion [defining] *adjacent* said open end and having [a] *an internal* diameter smaller than [said] *the internal diameter of the* main portion *and an external diameter smaller than the external diameter of the main portion*;
   (b) a probe plunger disposed in said tubular housing, said plunger comprising a cylindrical inner portion being a slide fit and disposed within said main portion of said tubular housing and a cylindrical outer portion of a diameter smaller than said inner portion and forming a shoulder with said inner portion at a point of meeting, said outer portion of said plunger passing through said retaining and sliding bearing portion and having an outside diameter which is a slide fit to the [inside] *internal* diameter of said retaining and sliding bearing portion; and,
   (c) a longitudinally compressible bias spring disposed between said generally closed end of said end tubular housing and said inner portion of said probe plunger under a pre-loading for biasing said probe plunger towards an extended position.

4. [In] *A method of making* a probe for providing electrical contact to electrical circuits during the testing thereof and having a probe plunger disposed in a tubular housing and urged outward under the force of longitudinally compressed bias spring, the method [of assembly] comprising the steps of:
   (a) [forming] *providing* a tubular housing having an open [and] *end,* a generally closed end *and an outside diameter*;
   (b) [forming] *providing* a plunger with a cylindrical inner portion to be a slide fit within the tubular housing and a cylindrical outer portion of a diameter smaller than the inner portion and forming a shoulder with the inner portion at a point of meeting;
   (c) inserting the bias spring into the tubular housing;
   (d) inserting the cylindrical inner portion of the plunger into the tubular housing and in contact with the spring;
   (e) compressing the spring with the inner portion to preload the spring and position the shoulder spaced inwardly from the open end of the housing; and
   (f) [compressing the portion] *reducing the outside diameter* of the tubular housing between [the shoulder and] the open end *and a point on the tubular housing, between the shoulder of the plunger within the tubular housing, when the spring is compressed thereby* to form an elongate retaining and sliding bearing region [defining] *that is adjacent* the open end [through] *within* which the outer portion of the plunger passes, wherein the retaining and sliding bearing region has an internal diameter which is a slide fit to the outside diameter of the outer portion of the plunger.

*5. A probe for providing electrical contact to electrical circuits during testing thereof, when made by the method of claim 4.*

6. A probe for providing electrical contact to electrical circuits during the testing thereof comprising:

(a) tubular housing having an open end and a generally closed end, said housing comprising a main portion, having an inner diameter and an outer diameter, extending from said generally closed end towards said open end and a elongate retaining and sliding bearing portion defining said open end and having an inner diameter smaller than the inner diameter of the main portion and an outer diameter smaller than the outer diameter of the main portion;

(b) a probe plunger disposed in said tubular housing, said plunger comprising a cylindrical inner portion being a slide fit and disposed within said main portion of said tubular housing and a cylindrical outer portion having a diameter smaller than that of said inner portion and forming a shoulder with said inner portion at a point of meeting, said outer portion of said plunger passing through said retaining and sliding bearing portion and having an outside diameter which is a slide fit to the inside diameter of said retaining and sliding bearing portion; and, (c) a longitudinally compressible bias spring disposed between said generally closed end of said end tubular housing and said inner portion of said probe plunger under a pre-loading for biasing said probe plunger towards an extended position, when made by a method comprising the steps of:

i) providing a tubular housing having an open and a generally closed end;

ii) providing a plunger with a cylindrical inner portion to be a slide fit within the tubular housing and a cylindrical outer portion of a diameter smaller than the inner portion and forming a shoulder with the inner portion at a point of meeting;

iii) inserting a bias spring into the tubular housing;

iv) inserting the cylindrical inner portion of the plunger into the tubular housing and in contact with the spring;

v) compressing the spring with the inner portion to pre-load the spring in a position with the shoulder spaced inwardly from the open end of the housing; and, vi) reducing the outer diameter and inner diameter of the portion of the tubular housing between the shoulder and the open end to form said elongate retaining and sliding bearing portion defining the open end through which the outer portion of the plunger passes wherein the retaining and sliding bearing portion has an internal diameter which is a slide fit to the outside diameter of the outer portion of the plunger.

* * * * *